US009829509B2

(12) United States Patent
Shimizu et al.

(10) Patent No.: US 9,829,509 B2
(45) Date of Patent: Nov. 28, 2017

(54) PROBE GUIDE PLATE AND SEMICONDUCTOR INSPECTION APPARATUS

(71) Applicant: SHINKO ELECTRIC INDUSTRIES CO., LTD., Nagano (JP)

(72) Inventors: Yuichiro Shimizu, Nagano (JP); Kosuke Fujihara, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 116 days.

(21) Appl. No.: 14/268,001

(22) Filed: May 2, 2014

(65) Prior Publication Data
US 2014/0354315 A1   Dec. 4, 2014

(30) Foreign Application Priority Data

May 28, 2013  (JP) .................................. 2013-112367

(51) Int. Cl.
*G01R 31/26*   (2014.01)
*G01R 1/073*   (2006.01)

(52) U.S. Cl.
CPC ..... *G01R 1/07371* (2013.01); *G01R 1/07314* (2013.01)

(58) Field of Classification Search
CPC ......... G01R 1/067; G01R 31/26; G01R 31/02
See application file for complete search history.

(56) References Cited

U.S. PATENT DOCUMENTS 5,772,451 A * 6/1998 Dozier, II ............ B23K 20/004
                                                                    257/E21.503
5,866,021 A * 2/1999 Yagi .................... B81C 1/00111
                                                                    216/84

(Continued)

FOREIGN PATENT DOCUMENTS

JP       2005-189086       7/2005
JP       2007-171139       7/2007

(Continued)

OTHER PUBLICATIONS

Office Action dated Nov. 22, 2016 issued with respect to the basic Japanese Patent Application No. 2013-112367.

(Continued)

*Primary Examiner* — Giovanni Astacio-Oquendo
*Assistant Examiner* — Alvaro Fortich
(74) *Attorney, Agent, or Firm* — IPUSA, PLLC

(57) ABSTRACT

A probe guide plate used for a semiconductor inspection apparatus that inputs and outputs an electrical signal for inspecting an object via a probe needle, the probe guide plate includes a silicon substrate provided with a through hole that penetrates the silicon substrate from one surface to another surface through which the probe needle is inserted, the through hole including a first tapered portion provided at an end portion at the one surface side such that the hole size of which increases as it approaches the one surface, and a second tapered portion provided at an end portion at the other surface side such that the hole size of which increases as it approaches the other surface; and a silicon oxide film formed on an inner wall surface of the through hole including the first tapered portion and the second tapered portion.

7 Claims, 6 Drawing Sheets

(56) References Cited

U.S. PATENT DOCUMENTS

| | | | | |
|---|---|---|---|---|
| 5,923,637 | A * | 7/1999 | Shimada | B82Y 35/00 369/126 |
| 6,033,935 | A * | 3/2000 | Dozier, II | B23K 3/087 257/E23.004 |
| 6,043,671 | A * | 3/2000 | Mizuta | G01R 31/2886 324/750.08 |
| 6,346,482 | B2 * | 2/2002 | Matsumoto | 257/E21.252 |
| 6,528,780 | B1 * | 3/2003 | Mitsuoka | B82Y 20/00 250/216 |
| 6,593,235 | B2 * | 7/2003 | Uochi | H01L 21/76804 257/E21.413 |
| 6,714,030 | B2 * | 3/2004 | Kohno | G01R 1/07314 257/E23.004 |
| 2002/0004320 | A1 * | 1/2002 | Pedersen | B23K 1/0016 439/66 |
| 2003/0189439 | A1 * | 10/2003 | Kohno | G01R 1/07314 324/754.07 |
| 2006/0082380 | A1 * | 4/2006 | Tanioka | G01R 31/2887 324/754.11 |
| 2007/0161285 | A1 | 7/2007 | Saitou | |
| 2007/0200574 | A1 * | 8/2007 | Sato | A63H 29/22 324/754.07 |
| 2007/0259506 | A1 * | 11/2007 | Hoshino | G01R 1/06716 438/400 |
| 2008/0048685 | A1 * | 2/2008 | Chui | G01R 1/07314 324/754.07 |
| 2008/0054486 | A1 | 3/2008 | Murayama et al. | |
| 2008/0217791 | A1 * | 9/2008 | Kojima | H01L 22/32 257/774 |
| 2009/0021924 | A1 | 1/2009 | Ogino et al. | |
| 2009/0284276 | A1 | 11/2009 | Taguchi et al. | |
| 2010/0231249 | A1 * | 9/2010 | Dang | G01R 1/0675 324/754.18 |
| 2013/0011996 | A1 | 1/2013 | Hasegawa | |
| 2015/0357231 | A1 | 12/2015 | Hasegawa | |

FOREIGN PATENT DOCUMENTS

| | | |
|---|---|---|
| JP | 2007-227341 | 9/2007 |
| JP | 2007-263650 | 10/2007 |
| JP | 2008-066481 | 3/2008 |
| JP | 2009-276316 | 11/2009 |
| JP | 2012-093127 | 5/2012 |
| JP | 2013-016672 | 1/2013 |

OTHER PUBLICATIONS

Office Action dated Aug. 22, 2017 issued with respect to the basic Japanese Patent Application No. 2013-112367.

* cited by examiner

PROBE GUIDE PLATE AND SEMICONDUCTOR INSPECTION APPARATUS

CROSS-REFERENCE TO RELATED APPLICATION

The present application is based on and claims the benefit of priority of Japanese Priority Application No. 2013-112367 filed on May 28, 2013, the entire contents of which are hereby incorporated by reference.

BACKGROUND OF THE INVENTION

1. Field of the Invention

The present invention relates to a probe guide plate and a semiconductor inspection apparatus using a probe guide plate.

2. Description of the Related Art

Conventionally, a semiconductor inspection apparatus has been used for inspecting semiconductor devices, in which probe needles are respectively inserted in guide holes of a probe guide plate. Specifically, by such a semiconductor inspection apparatus, electric characteristics of a semiconductor device is inspected by temporarily electrically connecting the semiconductor device with an external semiconductor inspection system by directly pushing front ends of probe needles to electrode pads of the semiconductor device.

As a material of the probe guide plate, ceramics, silicon or the like is used, for example. A ceramics probe guide plate is manufactured by forming guide holes by drilling after sintering machinable ceramics or the like. However, it is difficult to form small through holes by drilling, and there is a problem in that cost may be increased when the number of guide holes is increased.

On the other hand, a silicon probe guide plate is manufactured by forming guide holes by photolithography including patterning and dry etching and forming an silicon oxide film in the guide holes or the like by thermal oxidation or the like to ensure insulation properties, for example. As the guide holes are formed at the same time by photolithography, cost for manufacturing the silicon probe guide plate does not change depending on the number of guide holes. Thus, there is an advantage in manufacturing the silicon probe guide plate with guide holes of high density.

However, as a fracture toughness value of general silicon and a silicon oxide film is about 1 MPa·m$^{1/2}$, which is smaller than a fracture toughness value about 4 MPa·m$^{1/2}$ of general alumina ceramics. Thus, for the silicon probe guide plate, it is necessary to form the silicon oxide film to have a certain thickness (about 5 µm, for example) in order to ensure slidability of probe needles.

However, there has been a problem in that warp may be generated in the silicon probe guide plate due to a difference in thermal expansion coefficients of silicon and a silicon oxide film when the thickness of the silicon oxide film is made thicker in the silicon probe guide plate. Further, such warp tends to significantly occur when the guide holes are provided at a high density.

PATENT DOCUMENT

[Patent Document 1] Japanese Laid-open Patent Publication No. 2012-93127

SUMMARY OF THE INVENTION

The present invention is made in light of the above problems, and provides a silicon probe guide plate or the like in which generation of warp is reduced.

According to an embodiment, there is provided a probe guide plate used for a semiconductor inspection apparatus that inputs and outputs an electrical signal for inspecting an object via a probe needle, the probe guide plate including a silicon substrate provided with a through hole that penetrates the silicon substrate from one surface to another surface through which the probe needle is inserted, the through hole including a first tapered portion provided at an end portion at the one surface side such that the hole size of which increases as it approaches the one surface, and a second tapered portion provided at an end portion at the other surface side such that the hole size of which increases as it approaches the other surface; and a silicon oxide film formed on an inner wall surface of the through hole including the first tapered portion and the second tapered portion.

Note that also arbitrary combinations of the above-described elements, and any changes of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1:
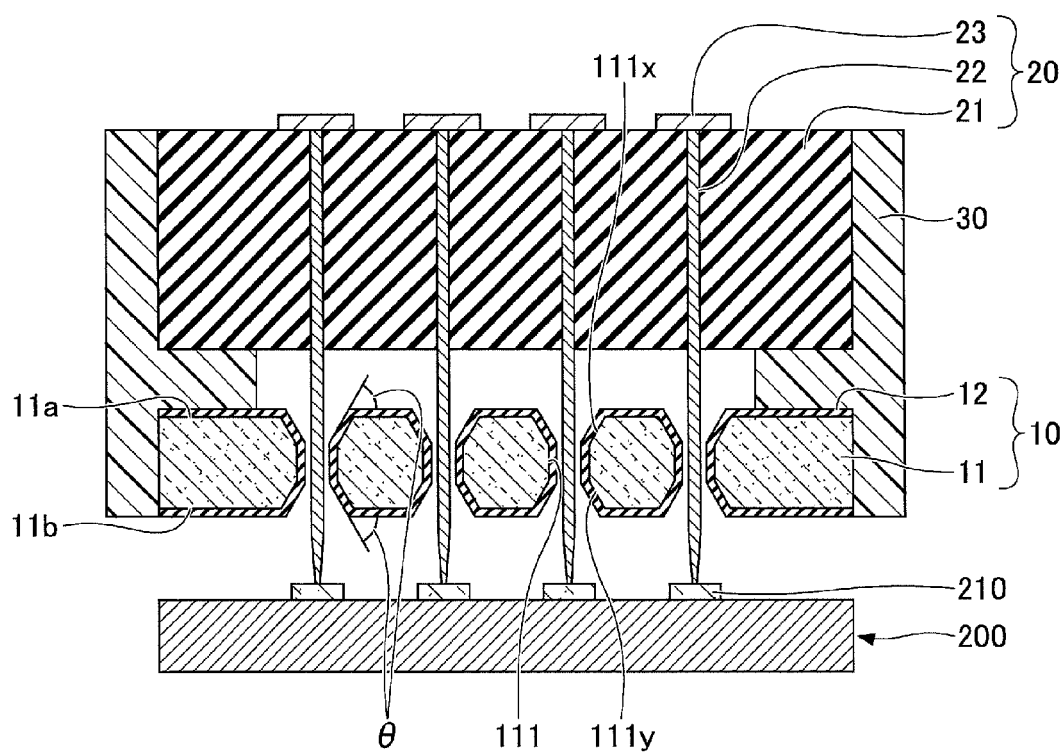
FIG. 1 is a cross-sectional view illustrating an example of a semiconductor inspection apparatus of a first embodiment.
Figure 1:
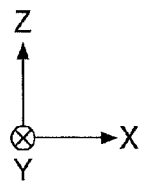

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment

Figure 2A:
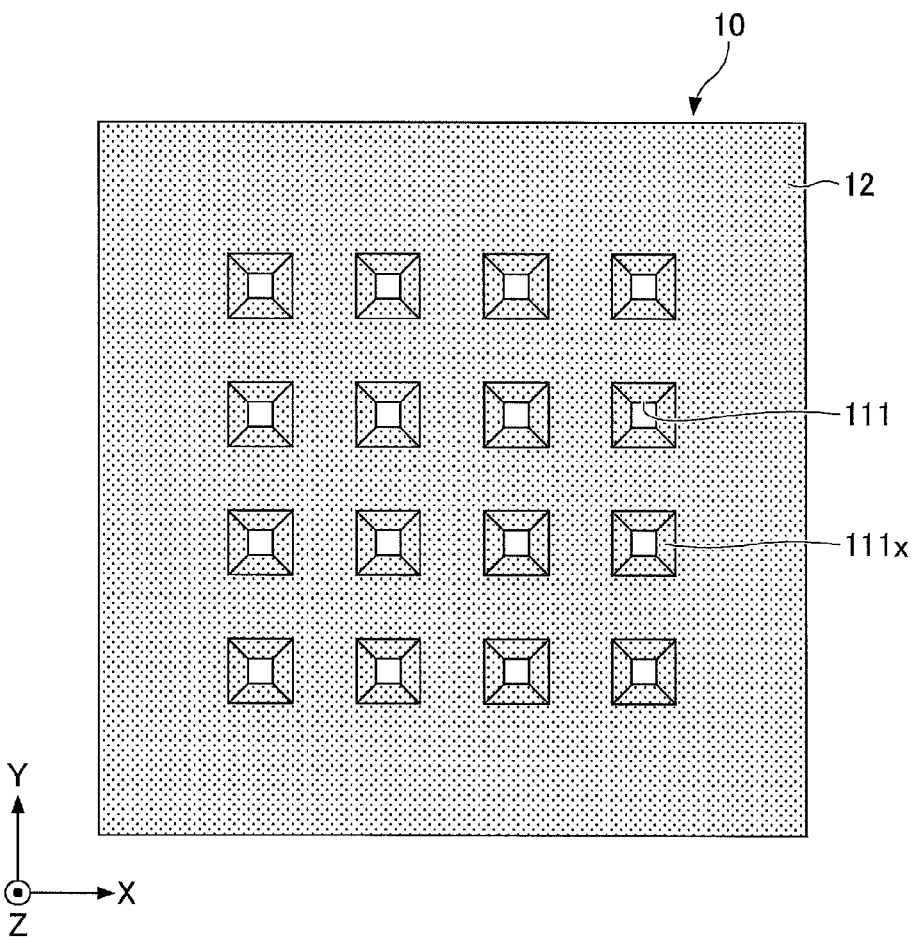
FIG. 2A and FIG. 2B are views illustrating an example of a probe guide plate used for the semiconductor inspection apparatus of the first embodiment.
Figure 2B:
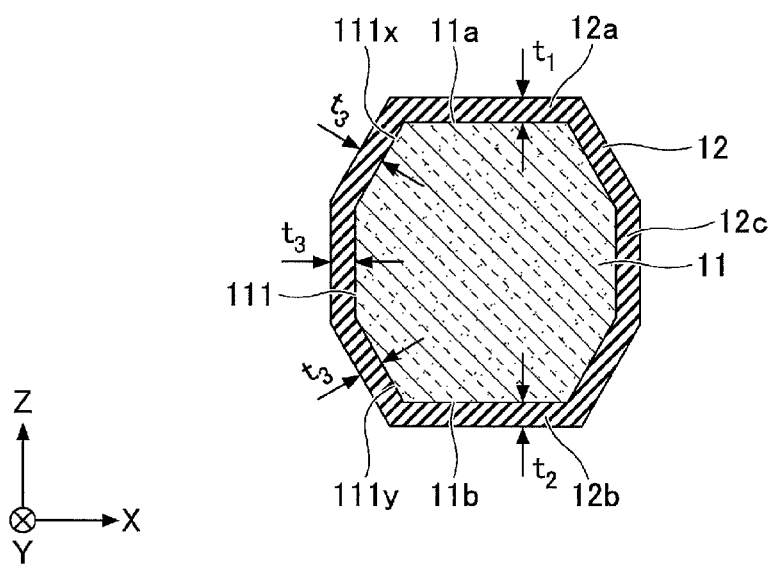

First, an example of a structure of a semiconductor inspection apparatus 1 of the first embodiment is explained. FIG. 1 is a cross-sectional view illustrating an example of the semiconductor inspection apparatus 1 of the first embodiment. FIG. 2A and FIG. 2B are views illustrating an example of a probe guide plate 10 used for the semiconductor inspection apparatus 1 of the first embodiment. FIG. 2A is a plan view and FIG. 2B is a partial enlarged cross-sectional view.

In FIG. 1, FIG. 2A and FIG. 2B, an X-direction is a direction parallel to a first surface 11a of a silicon substrate 11, which will be explained later, and a Y-direction is a direction perpendicular to the X-direction (depth direction of a paper surface). A Z-direction is a direction (thickness direction of the silicon substrate 11) perpendicular to the X-direction and the Y-direction (the same in other drawings). In FIG. 2A, the silicon oxide film 12 is expressed by dotted patterns for an explanation purpose.

With reference to FIG. 1, FIG. 2A and FIG. 2B, the semiconductor inspection apparatus 1 of the first embodiment inputs and outputs electrical signals for inspecting an object via a plurality of probe needles 22. The semiconductor inspection apparatus 1 includes a probe guide plate 10, a relay substrate 20 and a holder 30. The probe guide plate 10 and the relay substrate 20 are fixed by the holder 30 (positions of the probe guide plate 10 and the relay substrate 20 are determined by the holder 30).

In FIG. 1, a semiconductor device 200 is illustrated, which is an example of the object to be inspected by the semiconductor inspection apparatus 1. The semiconductor device 200 is provided with a plurality of electrode pads 210. Although FIG. 1 illustrates a status (an inspection status) in which the probe needles 22 of the semiconductor inspection apparatus 1 and the electrode pads 210 of the semiconductor device 200 are in contact with each other, respectively, the probe needles 22 and the electrode pads 210 come to a condition in which they are not in contact with each other, respectively, by moving the semiconductor inspection apparatus 1 in the Z-direction.

The probe guide plate 10 includes a silicon substrate 11 and a silicon oxide film 12. The silicon substrate 11 is provided with a plurality of through holes 111. The silicon substrate 11 may have a foursquare shape, a length of each edge of about 3 to 7 cm, in a plan view, for example. The thickness of the silicon substrate 11 (in the Z-direction) may be about 100 to 300 μm, for example. Here, "in a plan view" means a shape of an object seen from the Z-direction in FIG. 1, FIG. 2A and FIG. 2B.

Each of the through holes 111 penetrates the silicon substrate 11 from the first surface 11a to a second surface 11b, which is an opposite surface of the first surface 11a. The through holes 111 are aligned in the X-direction and in the Y-direction with a predetermined alignment pitch, for example. The alignment of the through holes 111 may be arbitrarily determined in accordance with an alignment of electrodes of an object to be inspected. An alignment pitch of the through holes 111 may be arbitrarily determined, and may be about 60 to 100 μm, for example. Each of the through holes 111 (a portion except a first tapered portion 111x and a second tapered portion 111y, which will be explained later) may have a foursquare shape, a length of each edge of about 40 to 80 μm, in a plan view, for example. Alternatively, each of the through holes 111 may have a rectangular shape, a circular shape, an ellipse shape or the like.

Each of the through holes 111 is provided with the first tapered portion 111x at an end portion of the first surface 11a side of the silicon substrate 11 whose hole size increases as it approaches the first surface 11a (the width becomes wider as it approaches the first surface 11a in a cross-sectional view). Each of the through holes 111 is provided with the second tapered portion 111y at an end portion of the second surface 11b side of the silicon substrate 11 whose diameter increases as it approaches the second surface 11b (the width becomes wider as it approaches the second surface 11b in a cross-sectional view). An inclined angle θ of the first tapered portion 111x or the second tapered portion 111y with respect to the first surface 11a of the silicon substrate 11 or the second surface 11b of the silicon substrate 11, respectively, is about 55 decree, for example.

The silicon oxide film 12 is formed on the first surface 11a, the second surface 11b and an inner wall surface of each of the through holes 111 including the first tapered portion 111x and the second tapered portion 111y, of the silicon substrate 11. The silicon oxide film 12 is provided to insulate the silicon substrate 11 from probe needles 22, which will be explained later.

The silicon oxide film 12 (which will be referred to as "12a" as well) formed at the first surface 11a of the silicon substrate 11 has a thickness $t_1$ (hereinafter, referred to as a "film thickness $t_1$"). The silicon oxide film 12 (which will be referred to as "12b" as well) formed at the second surface 11b of the silicon substrate 11 has a thickness $t_2$ (hereinafter, referred to as a "film thickness $t_2$"). The silicon oxide film 12 (which will be referred to as "12c" as well) formed at the inner wall surface of each of the through holes 111 including the first tapered portion 111x and the second tapered portion 111y has a thickness $t_3$ (hereinafter, referred to as a "film thickness $t_3$"). In this embodiment, the film thicknesses $t_1$, $t_2$ and $t_3$ of the silicon oxide film 12 are substantially the same within a range of 0.5 to 5 μm, and more preferably, within a range of 1 to 3 μm.

According to studies by the inventors, it has been revealed that sufficient insulating reliability can be ensured when the film thickness of the silicon oxide film 12 is thicker than or equal to 0.5 μm, and generation of warp in the probe guide plate 10 can be reduced when the film thickness of the silicon oxide film 12 is thinner than or equal to 5 μm (see examples). The reason why warp of the probe guide plate 10 becomes large when the film thickness of the silicon oxide film 12 is thicker is that there is a difference between thermal expansion coefficient (about 3 ppm/° C.) of silicon and thermal expansion coefficient (about 0.3 ppm/° C.) of a silicon oxide film (thermal oxide film).

The relay substrate 20 includes a substrate body 21, the plurality of probe needles 22 and a plurality of electrodes 23. For a material of the substrate body 21, ceramic, silicon, glass, insulating resin (epoxy-based resin or the like), or the like may be used, for example. The thickness of the substrate body 21 may be about 0.5 to 2 mm, for example.

The probe needles 22 are provided to penetrate the relay substrate 20 such that one end of each of the probe needles 22 at the probe guide plate 10 side protrudes from the relay substrate 20 and the other end of each of the probe needles 22 is connected with the respective electrode 23 provided at the surface of the relay substrate 20 at an opposite side of the probe guide plate 10 side. The probe needles 22 are provided at positions corresponding to electrode pads 210 of a semiconductor device 200, which is an example of the object to be inspected.

One end of each of the probe needles 22 protrudes from a surface of the relay substrate 20 at the probe guide plate 10 side, and further protrudes from the second surface 11b of the silicon substrate 11 of the probe guide plate 10 via the respective through hole 111 of the probe guide plate 10. The probe needles 22 protruded from the second surface 11b of the silicon substrate 11 contact the electrode pads 210 of the semiconductor device 200 to be electrically connected, respectively. As such, the through holes 111 function to guide the probe needles 22 that are inserted in the through holes 111, respectively.

As the probe needles 22 repeatedly contact the electrode pads 210 of the semiconductor device 200, respectively, the material for the probe needles 22 may be hard, hard to deform or capable of enduring abrasion. The material for the probe needles 22 may be nickel (Ni), copper (Cu), gold (Au), rhodium (Rh) or the like, for example. Although each of the probe needles 22 has a line shape in the example illustrated in FIG. 1, each of the probe needles 22 may have a curved or bent shape or the like that can adjust (absorb) a difference in alignment pitches of the electrodes 23 and the electrode pads 210 when the alignment pitch of the electrodes 23 is wider than the alignment pitch of the electrode pads 210, for example.

The electrodes 23 of the relay substrate 20 are electrically connected to the semiconductor inspection system (not illustrated in the drawings) via a wiring board (not illustrated in the drawings), an interposer (not illustrated in the drawings) or the like. The relay substrate 20 has a function to respectively relay electrical signals output from the electrode pads 210 of the semiconductor device 200 to the semiconductor inspection system (not illustrated in the drawings). Further, the relay substrate 20 has a function to respectively relay electrical signals from the semiconductor inspection system (not illustrated in the drawings) to input the electrode pads 210 of the semiconductor device 200.

As described above, the probe guide plate 10 and the relay substrate 20 are fixed by the holder 30 (positions of the probe guide plate 10 and the relay substrate 20 are determined by the holder 30). Here, the holder 30 may have a mechanism to relax a pressure caused between each of the probe needles 22 and the respective electrode pad 210.

When inspecting the semiconductor device 200, the semiconductor device 200 is mounted on a placing table (not illustrated in the drawings) capable of adjusting a position of the semiconductor device 200 with respect to the semiconductor inspection apparatus 1. Then, the position of the semiconductor device 200 is adjusted such that the probe needles 22 of the semiconductor inspection apparatus 1 match the electrode pads 210 of the semiconductor device 200, respectively. The semiconductor inspection apparatus 1 is configured to be movable in the Z-direction. Thereafter, by moving the semiconductor inspection apparatus 1 in the Z-direction (toward the semiconductor device 200), the probe needles 22 are pushed to the electrode pads 210 of the semiconductor device 200 with a predetermined force, respectively, so that a front end portion of each of the probe needles 22 contacts an upper surface of the respective electrode pad 210.

When the probe needles 22 contact the electrode pads 210, respectively, the electrode pads 210 are electrically connected with the semiconductor inspection system (not illustrated in the drawings). As a result, the semiconductor inspection system (not illustrated in the drawings) can inspect the electric characteristics of the semiconductor device 200. A probing test by which electrical connection between circuits of the semiconductor device 200 is examined, a burn-in test by which occurrence of failure is examined by applying a thermal or electrical stress to a circuit of the semiconductor device 200 at a high temperature to accelerate the occurrence of failure may be performed as the inspection of the electric characteristics. Further, a final test by which the semiconductor device 200 is examined with a high frequency signal or the like may be performed as the inspection of the electric characteristics.

Next, a method of manufacturing the probe guide plate 10 of the first embodiment is explained. FIG. 3A to FIG. 4B are views illustrating an example of manufacturing steps of the probe guide plate 10 used for the semiconductor inspection apparatus 1 of the first embodiment.

Figure 3A:
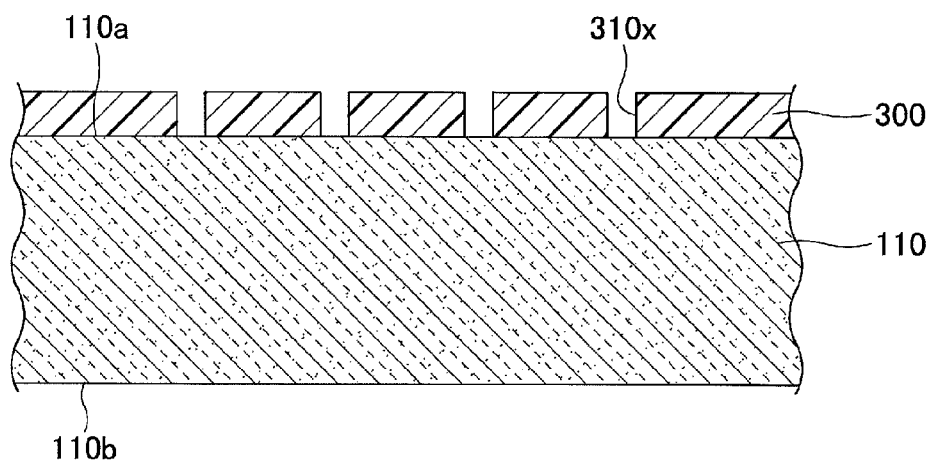
FIG. 3A to FIG. 3C are views illustrating an example of manufacturing steps of the probe guide plate used for the semiconductor inspection apparatus of the first embodiment.

First, in a step illustrated in FIG. 3A, a wafer 110, which becomes the silicon substrate 11, is prepared. Then, a resist layer 300 (any of negative or positive) provided with open portions 310x corresponding to the through holes 111 is formed on a first surface 110a of the wafer 110. For the wafer 110, a silicon wafer with a (100) surface having a diameter of 6 inch (about 150 mm), 8 inch (about 200 mm), 12 inch (about 300 mm) or the like may be used, for example. The thickness of the wafer 110 may be 0.625 mm (in case of 6 inch), 0.725 mm (in case of 8 inch), 0.775 mm (in case of 12 inch) or the like, for example. In this embodiment, an example is described in which the following steps are performed on the wafer and thereafter, the wafer is individualized. Alternatively, the wafer may be individualized first, and the following steps may be performed on the individualized components.

The resist layer 300 is formed by coating liquid or paste resist composed of photosensitive resin composition including acrylic-based resin, epoxy-based resin, imide-based resin or the like on the first surface 110a ((100) surface) of the wafer 110, for example. Alternatively, the resist layer 300 may be formed by laminating a film resist composed of photosensitive resin composition including acrylic-based resin, epoxy-based resin, imide-based resin or the like on the first surface 110a of the wafer 110, for example. Then, the open portions 310x are formed by exposing and developing the coated or laminated resist. With these processes, the resist layer 300 provided with the open portions 310x is formed. Further alternatively, a film resist previously provided with the open portions 310x may be laminated on the first surface 110a of the wafer 110.

Further, before forming the resist layer 300, an HMDS (hexamethyldisilazane) process may be performed on the first surface 110a of the wafer 110. With this process, adhesion between the resist layer 300 and the wafer 110 can be improved.

Figure 3B:
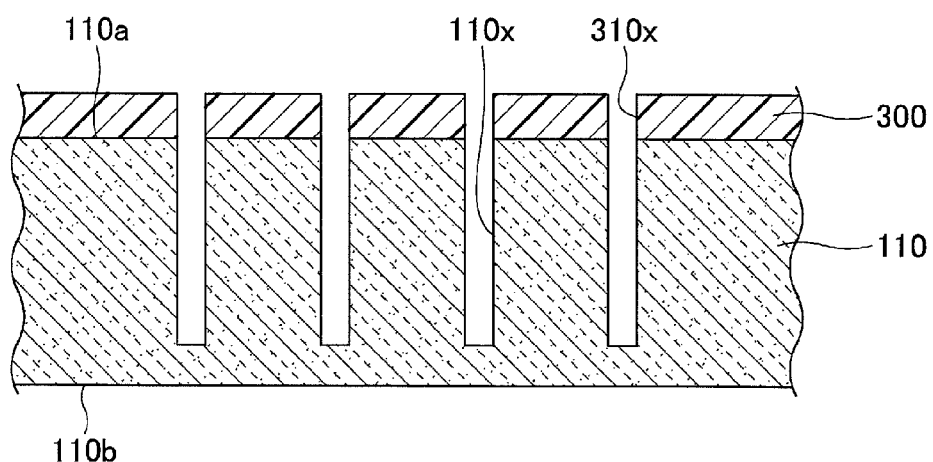

Then, in a step illustrated in FIG. 3B, the first surface 110a of the wafer 110 is provided with concave portions 110x by etching the wafer 110 from the first surface 110a of the wafer 110 using the resist layer 300 as a mask. The concave portions 110x may be formed by anisotropic dry etching such as reactive ion etching (DRIE: Deep Reactive Ion Etching) using $SF_6$ (sulfur hexafluoride) or the like, for example. The alignment pitch of the concave portions 110x corresponds to the alignment pitch of the open portions 310x, and may be about 60 to 100 µm, for example. Each of the concave portions 110x may have a foursquare shape, a length of each edge of about 40 to 80 µm, in a plan view.

Figure 3C:
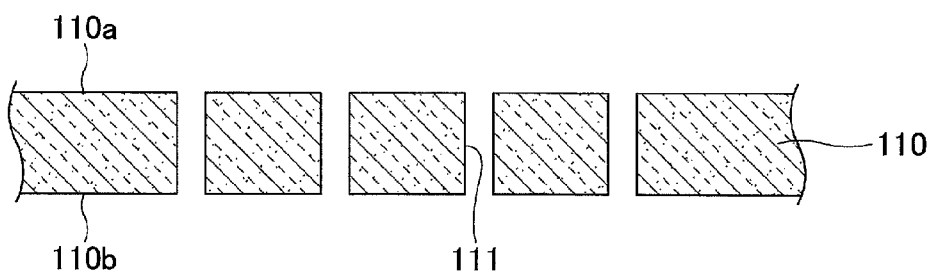

Next, in a step illustrated in FIG. 3C, the resist layer 300 (see FIG. 3B) is removed. Then, the wafer 110 is grinded from a second surface 110b ((100) surface) using a backside grinder or the like to be thinner. After grinding the wafer 110, the wafer 110 may be washed enough to remove shavings or the like. The thickness of the wafer 110 may be about 100 to 300 µm, for example. With this configuration, the through holes 111 that penetrate the wafer 110 are formed from the concave portions 110x, respectively. Here, in the step illustrated in FIG. 3B, the depth of each of the concave portions 110x may be made deeper than the thickness of the wafer 110 after being grinded in the step illustrated in FIG. 3C.

Figure 4A:
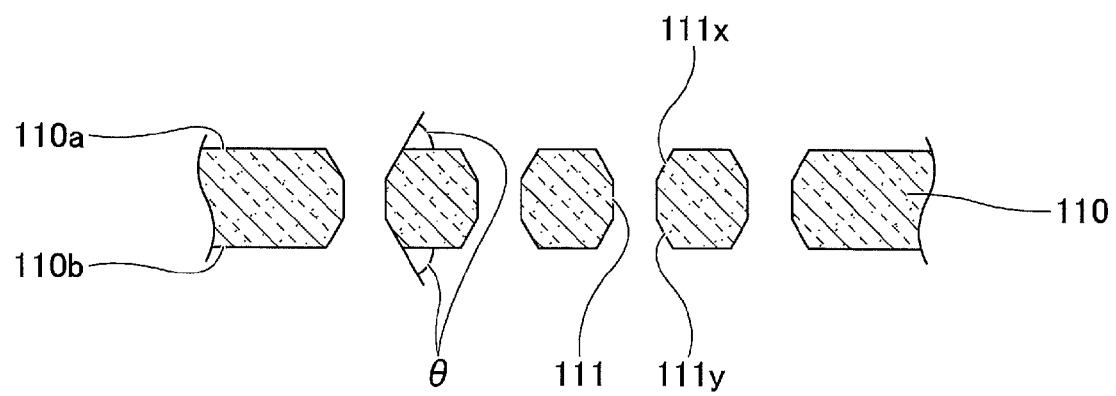
FIG. 4A and FIG. 4B are views illustrating an example of manufacturing steps of the probe guide plate used for the semiconductor inspection apparatus of the first embodiment.

Next, in a step illustrated in FIG. 4A, the first tapered portion 111x is formed at an end portion of each of the through holes 111 at the first surface 110a side of the wafer 110 and the second tapered portion 111y is formed at an end portion of each of the through holes ill at the second surface 110b of the wafer 110 by etching the wafer 110. The first tapered portion 111x and the second tapered portion 111y may be formed by performing anisotropic wet etching on the both end portions of each of the through holes 111 by immersing the wafer 110 in 25% TMAH (tetramethyl ammonium hydroxide) aqueous solution at about 90° C. for a predetermined period (about a few minutes), for example.

Further, a pretreatment such as an excimer process, a UV process (process of irradiating ultraviolet light), a plasma process or the like may be performed on the wafer 110 before the anisotropic wet etching in order to improve the wettability to the TMAH aqueous solution. By improving the wettability to the TMAH aqueous solution, the first tapered portion 111x and the second tapered portion 111y can be evenly formed.

The inclined angle θ of the first tapered portion 111x or the second tapered portion 111y, with respect to the first surface 110a or the second surface 110b of the wafer 110, respectively, may be about 55 degree, for example. Alternatively, the first tapered portion 111x and the second tapered portion 111y may be formed by anisotropic wet etching using alkaline aqueous solution such as KOH (potassium hydroxide), EDP (ethylenediamine•pyrocatechol) or the like, for example.

Figure 4B:
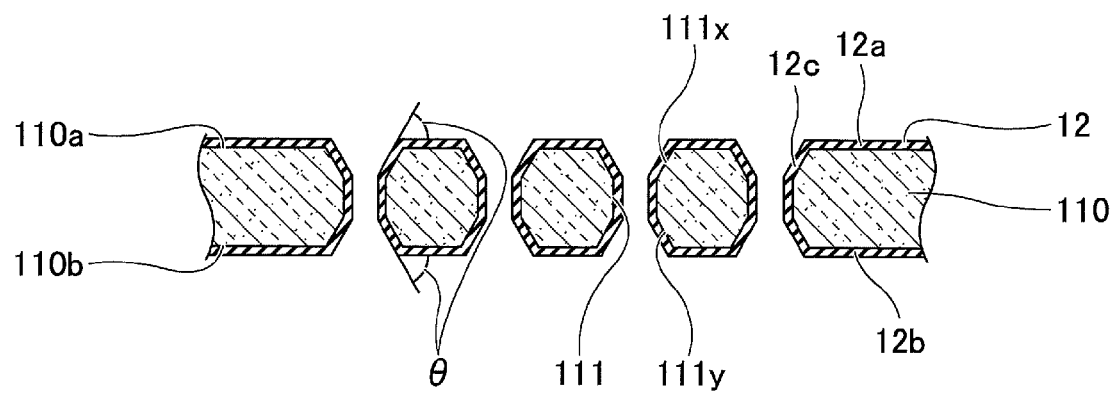

Next, in a step illustrated in FIG. 4B, the silicon oxide film 12 (12a, 12b and 12c) is integrally formed on the first surface 110a, the second surface 110b and the inner wall surface of each of the through holes 111 including the first tapered portion 111x and the second tapered portion 111y, of the wafer 110. The silicon oxide film 12 may be formed by wet thermal oxidation by which the vicinity of the surface of the wafer 110 is heated to be more than or equal to 1000° C., for example to thermally oxidize the surface of the wafer 110.

At this time, the film thicknesses of the silicon oxide film 12a formed on the first surface 11a, the silicon oxide film 12b formed on the second surface 11b and the silicon oxide film 12c formed on the inner wall surface of each of the through holes 111 are substantially the same. As illustrated in FIG. 2B, the film thicknesses $t_1$, $t_2$ and $t_3$ of the silicon oxide films 12a, 12b and 12c, respectively, may be substantially the same within a range of 0.5 to 5 μm, and more preferably, within a range of 1 to 3 μm, for example.

After the step illustrated in FIG. 4B, the wafer 110 on which the silicon oxide film 12 is formed is cut at predetermined positions by a dicer or the like. With this, the probe guide plate 10 (see FIG. 1, FIG. 2A and FIG. 2B) is formed.

According to the probe guide plate 10 of the first embodiment, the first tapered portion 111x and the second tapered portion 111y are formed at both end portions of each of the through holes 111. With this, a possibility that the probe needle 22 and the probe guide plate 10 are damaged can be reduced even when the probe needle 22 contacts the probe guide plate 10. For example, a possibility that a corner of the through hole 111 of the probe guide plate 10 is chipped can be reduced.

Further, as the possibility that the probe guide plate 10 is damaged can be reduced by providing the first tapered portion 111x and the second tapered portion 111y, the thickness of the silicon oxide film 12 that covers the silicon substrate 11 can be made thinner (0.5 to 5 μm, and more preferably, 1 to 3 μm, for example) compared with a conventional technique. With this, generation of warp in the probe guide plate 10 due to the difference in the thermal expansion coefficients of the silicon substrate 11 and the silicon oxide film 12 can be reduced.

Further, as the first tapered portion 111x and the second tapered portion 111y are provided, the silicon substrate 11 becomes symmetry in the thickness direction. With this configuration as well, generation of warp in the silicon substrate 11 (in other words, generation of warp in the probe guide plate 10) can be reduced.

Conventionally, warp in a probe guide plate is significantly generated if the guide holes for the probe needles are provided with high density. However, according to the probe guide plate 10, as generation of warp is reduced due to making the thickness of the silicon oxide film 12 thinner, it is possible to provide the through holes 111, which are guide holes, of the probe needle 22 with higher density.

ALTERNATIVE EXAMPLE OF FIRST EMBODIMENT

In the first embodiment, an example is described in which the film thicknesses $t_1$, $t_2$ and $t_3$ of the silicon oxide films 12a, 12b and 12c, respectively, are substantially the same. In an alternative example 1 of the first embodiment, an example is described in which the film thicknesses $t_1$ and $t_2$ of the silicon oxide films 12a and 12b are made thinner than the film thicknesses $t_3$ of the silicon oxide film 12c. In the alternative example 1 of the first embodiment, the same components as the first embodiment are given the same reference numerals, and explanations are not repeated.

Figure 5A:
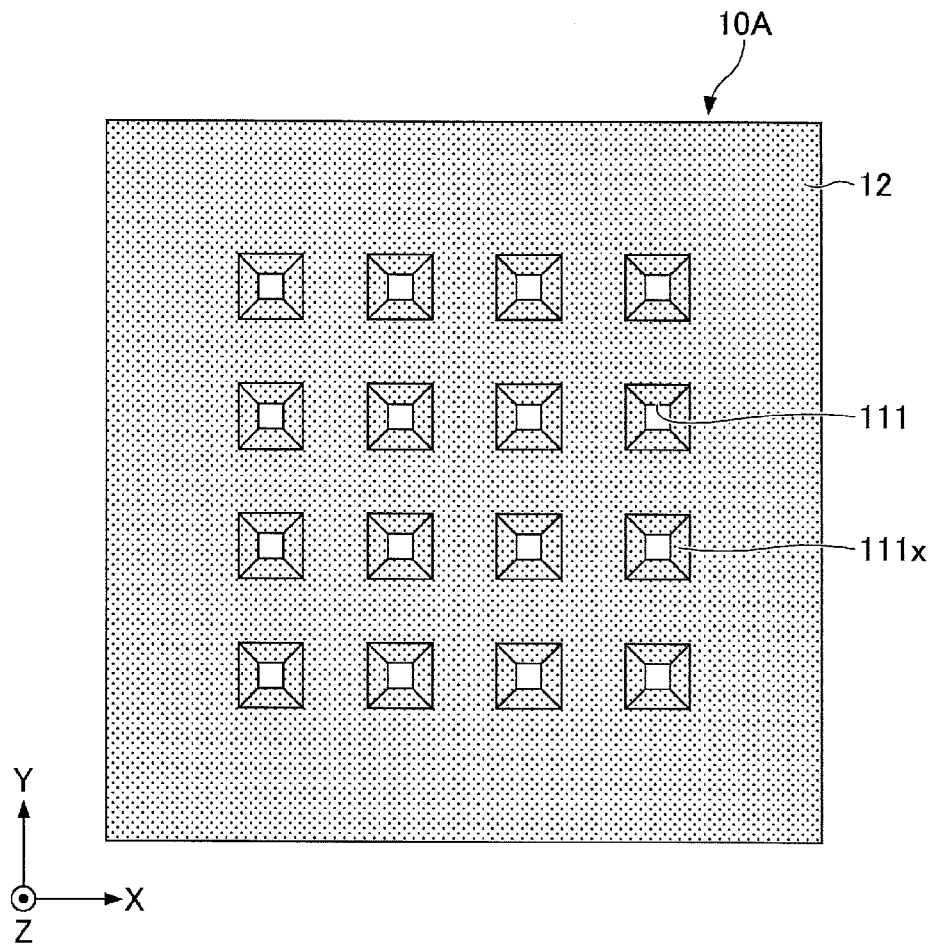
FIG. 5A and FIG. 5B are views illustrating an example of a probe guide plate used for the semiconductor inspection apparatus of an alternative example 1 of the first embodiment.
Figure 5B:
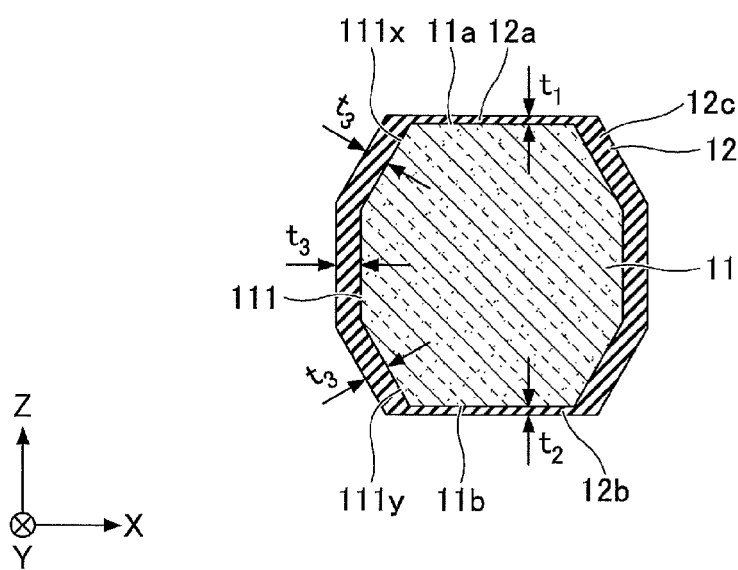

FIG. 5A and FIG. 5B are views illustrating an example of a probe guide plate 10A used for the semiconductor inspection apparatus 1 of the alternative example 1 of the first embodiment. FIG. 5A is a plan view and FIG. 5B is a partial enlarged cross-sectional view. In FIG. 5A, the silicon oxide film 12 is expressed by dotted patterns for an explanation purpose.

The cross-sectional view illustrating an example of the semiconductor inspection apparatus of the alternative example 1 of the first embodiment becomes the same as that illustrated in FIG. 1 except the thicknesses of the silicon oxide film 12 and thus, the cross-sectional view is not illustrated.

As illustrated in FIG. 5A and FIG. 5B, the probe guide plate 10A of the alternative example 1 of the first embodiment is different from the probe guide plate 10 (see FIG. 1, FIG. 2A and FIG. 2B) in that the film thicknesses $t_1$ and $t_2$ of the silicon oxide films 12a and 12b are thinner than the film thickness $t_3$ of the silicon oxide film 12c. The film thicknesses $t_1$, $t_2$ and $t_3$ of the silicon oxide film 12 (12a, 12b and 12c) may be 0.5 to 5 μm, and more preferably, within a range of 1 to 5 μm, for example, and have a relationship of $t_1 (\approx t_2) < t_3$.

The film thickness $t_1$ of the silicon oxide film 12a formed on the first surface 11a and the film thickness $t_2$ of the silicon oxide film 12b formed on the second surface 11b, of the silicon substrate 11, may be about 0.5 to 2 μm, respectively, for example. The film thickness $t_3$ of the silicon oxide film 12c formed at the inner wall surface of each of the through holes 111 including the first tapered portion 111x and the second tapered portion 111y may be about 5 μm, for example.

First, the same steps as those explained above with reference to FIG. 3A to FIG. 4A of the first embodiment are performed to manufacture the probe guide plate 10A. Then, in the step illustrated in FIG. 4B of the first embodiment, the silicon oxide film 12 (12a, 12b and 12c) whose thicknesses $t_1$, $t_2$ and $t_3$ are all about 5 μm is formed. Then, after the step illustrated in FIG. 4B of the first embodiment, resist is filled in each of the through holes 111 including the first tapered portion 111x and the second tapered portion 111y.

Next, the silicon oxide films 12a and 12b formed on the first surface 11a and the second surface 11b of the silicon substrate 11, respectively, are etched to make the film thicknesses of them (12a and 12b) thinner than the silicon oxide film 12c formed at the inner wall surface of each of the through holes 111. The film thickness of each of the silicon oxide films 12a and 12b may be about 0.5 to 2 μm, for example. Etching may be wet etching using buffered hydrofluoric acid, for example, dry etching using $CF_4$ (tetrafluoromethane), for example, or the like. Thereafter, the resist filled in each of the through holes 111 is removed. Then, the wafer 110 on which the silicon oxide film 12 (12a, 12b and 12c) is formed is cut at predetermined positions by a dicer or the like to obtain the probe guide plate 10A in which the thicknesses $t_1$ and $t_2$ of the silicon oxide films 12a and 12b, respectively, are thinner than the thickness $t_3$ of the silicon oxide film 12c.

According to the probe guide plate 10A of the alternative example 1 of the first embodiment, in addition to the advantages of the first embodiment, following advantages can be obtained.

The film thicknesses $t_1$ and $t_2$ of the silicon oxide films 12a and 12b, respectively, which are considered to influence more on generation of warp in the probe guide plate 10A, are made thinner than the film thickness $t_3$ of the silicon oxide film 12c, which is considered to influence less on generation of warp in the probe guide plate 10A. Thus, the generation of the warp in the probe guide plate 10A can be further reduced while ensuring insulation properties and slidability between the silicon oxide film 12 and each of the probe needles 22.

Here, it is exemplified that the film thickness $t_3$ of the silicon oxide film 12c is about 5 μm. Alternatively, the film thickness $t_3$ of the silicon oxide film 12c may be set thicker within a wider range as the film thickness $t_3$ of the silicon oxide film 12c influence less on the generation of the warp in the probe guide plate 10A. For example, the film thickness $t_3$ of the silicon oxide film 12c may be an arbitral value within a range of about 3 to 10 μm while considering the insulation properties or slidability between the silicon oxide film 12 and each of the probe needles 22.

ALTERNATIVE EXAMPLE 2 OF FIRST EMBODIMENT

In the first embodiment, an example is of the silicon oxide films 12a, 12b and 12c, respectively, are substantially the same. In an alternative example 2 of the first embodiment, an example is described in which the film thicknesses $t_1$ and $t_2$ of the silicon oxide film 12 (12a and 12b) are zero. In the alternative example 2 of the first embodiment, the same components as the first embodiment are given the same reference numerals, and explanations are not repeated.

Figure 6A:
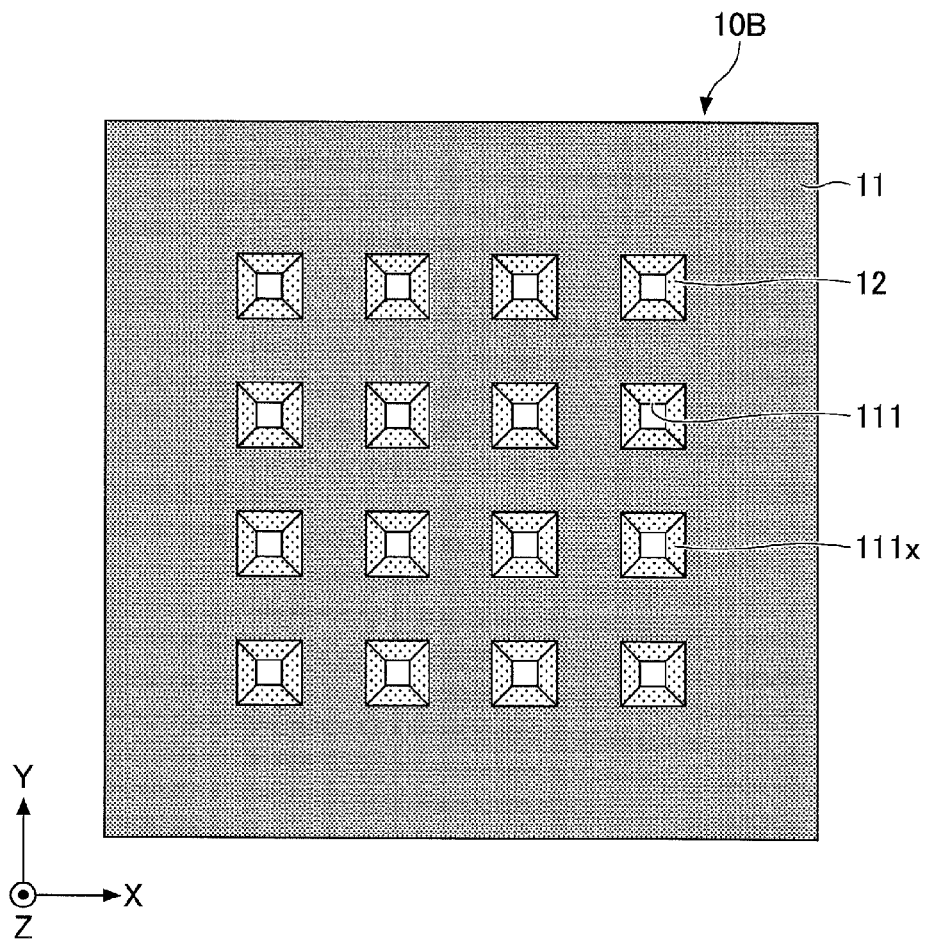
FIG. 6A and FIG. 6B are views illustrating an example of a probe guide plate used for the semiconductor inspection apparatus of an alternative example 2 of the first embodiment.
Figure 6B:
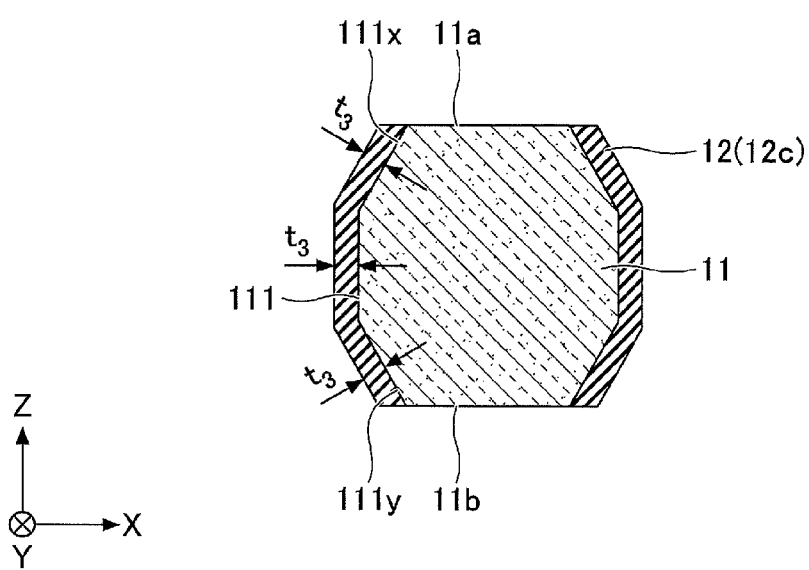

FIG. 6A and FIG. 6B are views illustrating an example of a probe guide plate 10B used for the semiconductor inspection apparatus 1 of the alternative example 2 of the first embodiment. FIG. 6A is a plan view and FIG. 6B is a partial enlarged cross-sectional view. In FIG. 6A, the silicon oxide film 12 is expressed by dotted patterns for an explanation purpose.

The cross-sectional view illustrating an example of the semiconductor inspection apparatus of the alternative example 2 of the first embodiment becomes the same as that illustrated in FIG. 1 except the thicknesses of the silicon oxide film 12 and thus, the cross-sectional view is not illustrated.

As illustrated in FIG. 6A and FIG. 6B, the probe guide plate 10B of the alternative example 2 of the first embodiment is different from the probe guide plate 10 (see FIG. 1, FIG. 2A and FIG. 2B) in that the silicon oxide film 12 is not formed on the first surface 11a and the second surface 11b of the silicon substrate 11. In FIG. 6B, parts corresponding to the silicon oxide films 12a and 12b with the film thicknesses $t_1$ and $t_2$, respectively, (see FIG. 2B or FIG. 5B) do not exist (in other words, $t_1=t_2=0$).

The silicon oxide film 12 (12c) is formed on the inner wall surface of each of the through holes 111 including the first tapered portion 111x and the second tapered portion 111y. The film thickness $t_3$ of the silicon oxide film 12c may be about 5 μm, for example.

The probe guide plate 10B may be manufactured by the same steps as those for the probe guide plate 10A of the alternative example 1 of the first embodiment. However, there is a difference in that the silicon oxide films 12a and 12b formed on the first surface 11a and the second surface 11b of the silicon substrate 11, respectively, are completely removed when etching the silicon oxide film 12 except the silicon oxide film 12c formed on the inner wall surface of each of the through holes 111 while each of the through holes 111 is filled with the resist as described above.

According to the probe guide plate 10B of the alternative example 2 of the first embodiment, in addition to the advantages of the first embodiment, following advantages can be obtained.

The silicon oxide films 12a and 12b, which are considered to influence more on generation of warp in the probe guide plate 10A, are completely removed. Then, only the silicon oxide film 12c, which is considered to influence less on generation of warp in the probe guide plate 10A, is left. Thus, the generation of the warp in the probe guide plate 10B can be further reduced while ensuring insulation properties and slidability between the silicon oxide film 12 and each of the probe needles 22. However, regarding the insulation properties, the probe guide plate 10 of the first embodiment or the probe guide plate 10A of the alternative example 1 of the first embodiment may have more advantage.

Here, similar to the alternative example 1 of the first embodiment, the film thickness $t_3$ of the silicon oxide film 12c may be set at an arbitral value within a range of about 3 to 10 μm.

EXAMPLE

Simulation was conducted on generation of warp in the probe guide plate 10 while varying the film thickness ($t_1=t_2=t_3$) of the silicon oxide film 12 of the probe guide plate 10 of the first embodiment (see FIG. 1, FIG. 2A and FIG. 2B). The silicon substrate 11 had a rectangular shape of 25 mm×20 mm, in a plan view, with a thickness of 150 μm. The silicon substrate 11 was provided with 300 through holes 111 with an alignment pitch of 300 μm. Each of the through holes 111 (a portion except the first tapered portion 111x and the second tapered portion 111y) had a foursquare shape, a length of each edge of about 250 μm, in a plan view. A result of the simulation is illustrated in Table 1.

TABLE 1

| THICKNESS OF SILICON OXIDE FILM 12 | 5 μm | 3 μm | 1 μm |
|---|---|---|---|
| WARPED AMOUNT | 260 μm | 115 μm | 1.0 μm |

As illustrated in Table 1, it was confirmed that the thinner the film thickness ($t_1=t_2=t_3$) of the silicon oxide film 12 was, the less the warped amount of the probe guide plate 10 became.

As described above, the thermal expansion coefficient of silicon is about 3 ppm/° C. and the thermal expansion coefficient of the silicon oxide film is about 0.3 ppm/° C. It is considered that the warped amount in the probe guide plate 10 is increased as the thickness of the silicon oxide film 12 becomes thicker due to the difference in such thermal expansion coefficients.

Here, the thickness of the silicon oxide film 12 in a direction perpendicular to the thickness direction (the Z direction) of the silicon substrate 11 influence less on the generation of the warp in the probe guide plate 10. In other words, it is considered that the film thickness $t_3$ of the silicon oxide film 12 formed on the inner wall surface of each of the through holes 111 including the first tapered portion 111$x$ and the second tapered portion 111$y$ does not influence generation of the warp in the probe guide plate 10. Thus, it can be considered that the generation of the warp in the probe guide plate 10 can be reduced by making only the film thicknesses $t_1$ and $t_2$ of the silicon oxide films 12$a$ and 12$b$ thinner (including a case where $t_1=t_2=0$), without reducing all of the film thicknesses $t_1$, $t_2$ and $t_3$ of the silicon oxide film 12.

By making the only the film thicknesses $t_1$ and $t_2$ thinner (including a case where $t_1=t_2=0$), without changing the film thickness $t_3$ of the silicon oxide film 12, the generation of the warp of the probe guide plate can be reduced while ensuring insulation properties and slidability between the silicon oxide film 12 and each of the probe needles 22.

In other words, in order to ensure the insulation properties and the slidability between the silicon oxide film 12 and each of the probe needles 22, it is preferable to make the film thickness of the silicon oxide film 12 thinner. On the other hand, in order to reduce the generation of the warp in the probe guide plate 10, it is preferable to make the film thickness of the silicon oxide film 12 thinner. Thus, by only reducing the film thicknesses $t_1$ and $t_2$ of the film thickness of the silicon oxide film 12 (including a case where $t_1=t_2=0$) without reducing the film thickness $t_3$ of the silicon oxide film 12, both of these advantages can be obtained.

According to the embodiments, a silicon probe guide plate or the like in which generation of warp is reduced can be provided.

Various aspects of the subject-matter described herein are set out non-exhaustively in the following numbered clauses:

1. A method of manufacturing a probe guide plate used for a semiconductor inspection apparatus that inputs and outputs an electrical signal for inspecting an object via a probe needle, comprising:
    forming a through hole that penetrates one surface of a silicon substrate to another surface of the silicon substrate and through which the probe needle is inserted;
    forming a first tapered portion and a second tapered portion at an end portion of the through hole at the one surface side and at an end portion of the through hole at the other surface side, respectively, by performing anisotropic wet etching on the silicon substrate in which the through hole is formed, the hole size of the first tapered portion increasing as it approaches the one surface side of the silicon substrate, and the hole size of the second tapered portion increasing as it approaches the other surface side of the silicon substrate; and
    forming a silicon oxide film on an inner wall surface of the through hole including the first tapered portion and the second tapered portion by performing thermal oxidation on the silicon substrate.

2. The method of manufacturing the probe guide plate according to clause 1,
    wherein the forming the silicon oxide film includes
    integrally forming a silicon oxide film on the one surface, the other surface and the inner wall surface of the through hole including the first tapered portion and the second tapered portion, and
    making the film thicknesses of the silicon oxide film formed on the one surface and the other surface thinner than the film thickness of the silicon oxide film formed on the inner wall surface of the through hole by etching the silicon oxide film formed on the one surface and the other surface.

3. The method of manufacturing the probe guide plate according to clause 1,
    the one surface and the other surface of the silicon substrate are (100) surface of the silicon substrate, respectively.

4. The method of manufacturing the probe guide plate according to clause 1, further comprising:
    before the forming the first tapered portion and the second tapered portion, performing an excimer process, a process of irradiating ultraviolet light or a plasma process on the silicon substrate, and
    wherein in the forming the first tapered portion and the second tapered portion, anisotropic wet etching is performed using tetramethyl ammonium hydroxide aqueous solution.

Although a preferred embodiment of the probe guide plate, the semiconductor inspection apparatus and the method of manufacturing the probe guide plate has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

What is claimed is:

1. A probe guide plate used for a semiconductor inspection apparatus that inputs and outputs an electrical signal for inspecting an object via a probe needle, the probe guide plate comprising:
    a silicon substrate provided with a through hole that penetrates the silicon substrate from a first surface to a second surface through which the probe needle is inserted, the first surface and the second surface being opposite surfaces of the same single silicon substrate,
    the through hole including
        a first tapered portion provided at a first end portion of the through hole at the first surface of the silicon substrate such that a diameter of the first portion increases as it approaches the first surface,
        a second tapered portion provided at a second end portion of the through hole at the second surface of the silicon substrate such that a diameter of the second portion increases as it approaches the second surface, and a central portion that connects the first tapered portion and the second tapered portion, the central portion provided at an angle with respect to the first tapered portion, and provided at an angle with respect to the second tapered portion; and a silicon oxide film formed on an inner wall surface of the through hole including the first tapered portion and the second tapered portion, the silicon oxide film being formed between the silicon substrate and an area through which the probe needle is to be inserted, wherein the through hole allows the probe needle to penetrate the silicon substrate from the first surface to the second surface.

2. The probe guide plate according to claim 1, further comprising:

silicon oxide films respectively formed on the first surface and the second surface of the silicon substrate, film thicknesses of the silicon oxide films formed on the first surface and the second surface being thinner than a film thickness of the silicon oxide film formed on the inner wall surface of the through hole.

3. The probe guide plate according to claim 1,
wherein the first surface and the second surface are (100) surface of the silicon substrate, respectively.

4. A semiconductor inspection apparatus comprising:
the probe guide plate according to claim 1; and
a probe needle that is inserted in the through hole, the semiconductor inspection apparatus being configured to input and output an electrical signal for inspecting an object via the probe needle.

5. The probe guide plate according to claim 1,
wherein the through hole are wider at the first surface and the second surface, which are outside surfaces of the silicon substrate, than at inner side of the silicon substrate.

6. The probe guide plate according to claim 1,
wherein the thickness of the silicon oxide film formed on the inner wall surface of the through hole is within a range of about 3 to 10 μm.

7. The probe guide plate according to claim 1,
wherein an silicon oxide film is not formed on each of the first surface and the second surface of the silicon substrate.

* * * * *